United States Patent
Chen et al.

(10) Patent No.: US 10,651,242 B2
(45) Date of Patent: May 12, 2020

(54) OLED DEVICE AND DISPLAY APPARATUS

(71) Applicant: Wuhan China Star Optoelectronics Semiconductor Display Technology Co., Ltd., Wuhan, Hubei (CN)

(72) Inventors: Caiqin Chen, Guangdong (CN); Zhiyuan Shen, Guangdong (CN); Xing Ming, Guangdong (CN); Tao Sun, Guangdong (CN); Lin Meng, Guangdong (CN); Yu Zhao, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 14 days.

(21) Appl. No.: 15/970,379

(22) Filed: May 3, 2018

(65) Prior Publication Data

US 2019/0006435 A1 Jan. 3, 2019

Related U.S. Application Data

(63) Continuation of application No. PCT/CN2018/072613, filed on Jan. 15, 2018.

(30) Foreign Application Priority Data

Jun. 28, 2017 (CN) .......................... 2017 1 0513522

(51) Int. Cl.
*H01L 27/32* (2006.01)
*G09G 3/3208* (2016.01)
(Continued)

(52) U.S. Cl.
CPC ........ *H01L 27/3211* (2013.01); *G09G 3/3208* (2013.01); *H01L 27/3246* (2013.01);
(Continued)

(58) Field of Classification Search
CPC ............. H01L 27/3246; H01L 27/3211; H01L 27/3218; H01L 27/3216; H01L 51/5284;
(Continued)

(56) References Cited

U.S. PATENT DOCUMENTS 9,196,872 B2 11/2015 Son
2014/0361260 A1* 12/2014 Kim .................... H01L 27/3246
257/40
2016/0240593 A1* 8/2016 Gu ...................... G09G 3/3225

FOREIGN PATENT DOCUMENTS

CN 104518004 A 4/2015
CN 104576694 A 4/2015
(Continued)

*Primary Examiner* — William Boddie
*Assistant Examiner* — Alecia D English
(74) *Attorney, Agent, or Firm* — Hemisphere Law, PLLC; Zhigang Ma (57) ABSTRACT

An OLED device is provided, including a substrate and a plurality of OLED subpixels arranged on the substrate. An insulating barrier is provided between every two adjacent OLED subpixels with different colors, and the barrier is configured to block a carrier diffusion between the two adjacent OLED subpixels. The disclosure further provides a display apparatus including the OLED device, which can prevent the light emission crosstalk between the adjacent OLED subpixels and avoid the color coordinate shift of the OLED subpixels.

10 Claims, 8 Drawing Sheets

(51) Int. Cl.
*H01L 51/52* (2006.01)
*H01L 51/50* (2006.01)
(52) U.S. Cl.
CPC ...... *H01L 51/5056* (2013.01); *H01L 51/5206* (2013.01); *H01L 51/5221* (2013.01); *G09G 2320/0242* (2013.01); *H01L 27/3213* (2013.01); *H01L 27/3216* (2013.01); *H01L 27/3218* (2013.01); *H01L 51/5225* (2013.01)
(58) Field of Classification Search
CPC ............. H01L 51/5209; H01L 51/5056; H01L 51/5096; H01L 51/5225; H01L 27/326; G09G 3/3208
See application file for complete search history.

(56) References Cited

FOREIGN PATENT DOCUMENTS

| | | | |
|---|---|---|---|
| CN | 206293473 A | | 6/2017 |
| CN | 107275377 A | | 10/2017 |
| KR | 100768711 | * | 10/2007 |

* cited by examiner

OLED DEVICE AND DISPLAY APPARATUS

RELATED APPLICATIONS

This application is a continuation application of PCT Patent Application No. PCT/CN2018/072613, filed Jan. 15, 2018, which claims the priority benefit of Chinese Patent Application No. 201710513522.5, filed Jun. 28, 2017, which is herein incorporated by reference in its entirety.

FIELD OF THE DISCLOSURE

The disclosure relates to a display technical field, and more particularly to an OELD device and a display apparatus comprising the OLED device.

BACKGROUND

AMOLED (Active Matrix Organic Light Emitting Diode) display is a self-luminous display using OLED (Organic Light Emitting Diode) technology. With its wide color gamut, high contrast, slim design and lower energy consumption, it is becoming the primary choice for next-generation display technologies.

Figure 1:
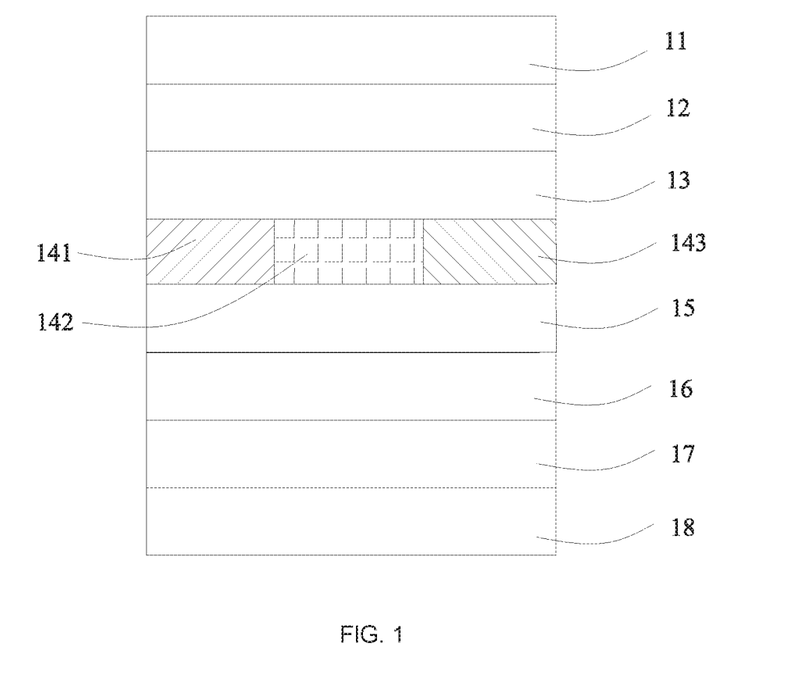
FIG. 1 is a schematic cross-sectional view of a subpixel structure of an AMOLED display panel in the prior art.

As shown in FIG. 1, a subpixel structure of an AMOLED display panel includes a cover 1, a cathode 12, an electron transport layer 13, organic light-emitting layers 141 to 143, a hole transport layer 15, a hole injection layer 16, an anode 17, an array substrate 18 and the like. When a voltage is applied between the cathode 12 and the anode 17, electrons are injected from the cathode 12 to the electron transport layer 13, and holes are injected from the anode 17 to the hole transport layer 15. Then, the electrons and holes migrate to the organic light-emitting layers 141 to 143 through the electron transport layer 13 and the hole transport layer 15, respectively, and meet in the organic light-emitting layers 141 to 143 to form excitons. Excitons make the luminescent molecules excited, and the luminescent molecules emit visible light after radiation relaxation.

Electron migration is under the effect of electric field, from the electron transport layer 13 to the organic light-emitting layers 141 to 143. Electrons can also diffuse within the electron transport layer 13 under diffusion effect. Since the electron transport layer 13 continuously covers the adjacent subpixels, the electrons can diffuse in an area of the electron transport layer 13 corresponding to the adjacent subpixels. In the low grayscale display, due to the small voltage between the cathode 12 and the anode 17, that is, the electric field force exerted by the electric field is small, the movement of some electrons is affected by diffusion more than the force of the electric field. This part of the electrons is easily to diffuse into the adjacent subpixel regions and migrate to the organic light-emitting layers of the adjacent subpixels to recombine with the holes in the adjacent subpixels, so as to cause light emission crosstalk to the adjacent subpixels. This causes the color coordinates of the adjacent subpixels to shift, resulting in an abnormal color shift.

SUMMARY

Accordingly, the present disclosure provides an OLED device and a display apparatus having the OLED device.

An OLED device, comprises a substrate on which a plurality of OLED subpixels are arranged, wherein an insulating barrier is provided between every two adjacent OLED subpixels with different colors, and the barrier is configured to block a carrier diffusion between the two adjacent OLED subpixels.

Herein, the plurality of OLED subpixels form a plurality of OLED pixels, each of every two adjacent OLED pixels comprises four OLED subpixels, and the four OLED subpixels have three colors.

Herein, among the two adjacent OLED pixels, one barrier is provided between the two OLED subpixels with different colors, and a gap is provided between the two OLED subpixels having the same color.

Herein, among the two adjacent OLED pixels, one barrier is provided between the two OLED subpixels with different colors, and the two OLED subpixels with the same color are integrally connected.

Herein, among the two adjacent OLED pixels, four OLED subpixels are arranged in a rhombus, one rhombus and another adjacent rhombus share one of the OLED subpixels; and in each of the rhombuses, the two OLED subpixels with the same color are respectively located at two opposite vertexes of the rhombus; and one of the barriers is provided on each side of the rhombus.

Herein, in each of the rhombuses, two of the barriers located on opposite sides of the rhombus are connected in a straight line.

Herein, among the plurality of rhombuses in the same row, each of every two adjacent straight lines has an included angle to form a wavy shape.

Herein, the plurality of the straight lines among the plurality of rhombuses are parallel.

Herein, each of the OLED subpixels comprises an anode, a hole injection layer, a hole transport layer, an organic light-emitting layer, an electron transport layer and a cathode sequentially stacked on the substrate; the barrier is disposed on the substrate and sequentially penetrates the hole injection layer, the hole transport layer, the organic light-emitting layer, the electron transport layer and the cathode.

A display apparatus having the foregoing OLED device.

Herein, the plurality of OLED subpixels form a plurality of OLED pixels, each of every two adjacent OLED pixels comprises four OLED subpixels, and the four OLED subpixels have three colors.

Herein, among the two adjacent OLED pixels, one barrier is provided between the two OLED subpixels with different colors, and a gap is provided between the two OLED subpixels having the same color.

Herein, among the two adjacent OLED pixels, one barrier is provided between the two OLED subpixels with different colors, and the two OLED subpixels with the same color are integrally connected.

Herein, among the two adjacent OLED pixels, four OLED subpixels are arranged in a rhombus; one rhombus and another adjacent rhombus share one of the OLED subpixels; and in each of the rhombuses, the two OLED subpixels with the same color are respectively located at two opposite vertexes of the rhombus; and one of the barriers is provided on each side of the rhombus.

Herein, in each of the rhombuses, two of the barriers located on opposite sides of the rhombus are connected in a straight line.

Herein, among the plurality of rhombuses in the same row, each of every two adjacent straight lines has an included angle to form a wavy shape.

Herein, the plurality of the straight lines among the plurality of rhombuses are parallel.

In the present disclosure, since the barrier is provided, the electrons and holes in the adjacent OLED subpixels will be blocked by the barrier when the electrons and holes in the adjacent OLED subpixels are diffused in the respective transport layers; so that electrons and holes can not be diffused into the transmission layer of the other party, thus not interfering with the electron-hole recombination emission of the other party. Therefore, it is possible to prevent the emission crosstalk between the adjacent OLED subpixels and avoid the color coordinate shift of the OLED subpixels.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts.

DETAILED DESCRIPTION OF PREFERRED EMBODIMENTS

The technical solutions of the present disclosure are described below with reference to the accompanying drawings in the embodiments. Apparently, the described embodiments are merely a part but not all of the embodiments of the present disclosure. All other embodiments obtained by a person of ordinary skill in the art based on the embodiments of the present disclosure without creative efforts shall fall in the protection scope of this disclosure.

In addition, the description of the following embodiments is with reference to the appended drawings, for illustrating the specific embodiments that the present disclosure may be implemented in. Directional terms referred in this disclosure, such as "up", "down", "front", "back", "left", "right", "inside", "outside", "side" are used to refer to the attached drawings. Therefore, the directional terms are used to better and clearly describe and understand the present disclosure, rather than indicating or implying that the devices or elements referred to must have a specific orientation, specific orientation structure or operation, and therefore it cannot be understood as a limitation of the present disclosure.

In the description of the present disclosure, it should be noted that the terms "installed," "connected," "connected," "disposed on" should be broadly understood unless the context clearly dictates otherwise. For example, the terms "fixed connections" may also be detachably connected or integrally connected; they may be mechanical connections; they may be directly connected or indirectly connected through an intermediary medium, and may be internal connections of two elements. For those skilled in the art, the specific meanings of the above terms in this application may be understood in specific cases.

In addition, in the description of the present disclosure, the meaning of "plural" unless otherwise stated is two or more. The phrase "process" appearing in this specification means not only an independent process, but also a term that is intended to achieve the intended function of the process when it cannot be clearly distinguished from other processes. The numerical range denoted by "~" in the present disclosure means a range including the numerical values described before and after "~" as the minimum value and the maximum value, respectively. In the drawings, elements that are similar in structure or the same are denoted by the same reference numerals.

The following embodiment of the present disclosure provides a display apparatus, which includes but nor limits to a display panel. The display apparatus comprises OLED device. The OLED device includes but not limits to an AMOLED device, for example, it could be PMOLED (Passive Matrix Organic Light Emitting Diode), FOLED (Flexible OLED) and so on.

Figure 2:
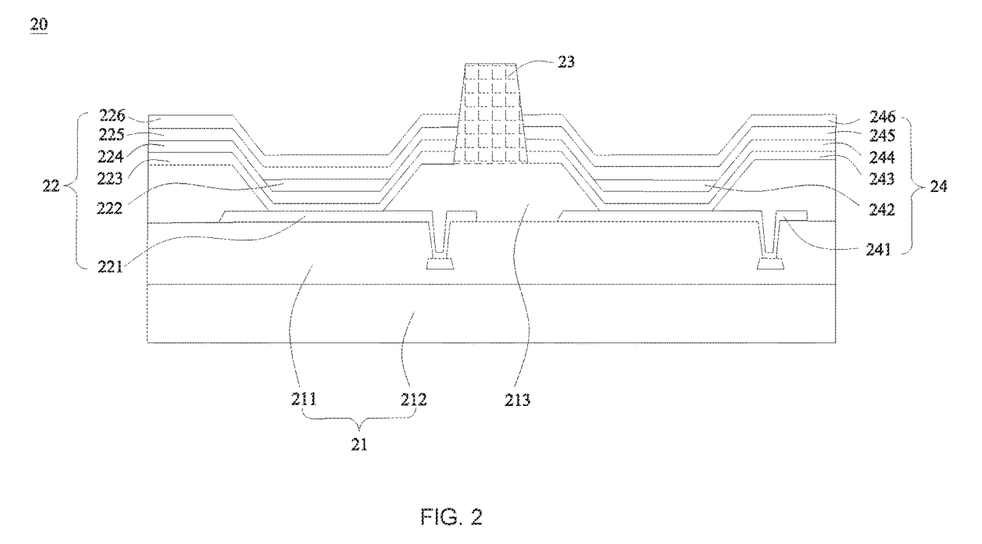
FIG. 2 is a schematic cross-sectional view of an OLED device according to one embodiment of the present disclosure.

As shown in FIG. 2, the present embodiment provides an OLED device 20, comprising a substrate 21 on which a plurality of OLED subpixels are arranged, such as OLED subpixels 22 and 24. Wherein, an insulating barrier 23 is provided between every two adjacent OLED subpixels with different colors, and the barrier 23 is configured to block a carrier diffusion between the two adjacent OLED subpixels. For example, the OLED subpixel 22 and 24 are different colors, a barrier 23 is disposed therebetween, and the barrier 23 is able to block a carrier diffusion between the two adjacent OLED subpixels.

In particular, as shown in FIG. 2, the OLED subpixel 22 can comprise an anode 221, a hole injection layer 223, a hole transport layer 224, an organic light-emitting layer 222, an electron transport layer 225 and a cathode 226 sequentially stacked on the substrate 21. The OLED subpixel 24 can also comprise an anode 241, a hole injection layer 243, a hole transport layer 244, an organic light-emitting layer 242, an electron transport layer 245 and a cathode 246 sequentially stacked on the substrate 21.

The barrier 23 is disposed on the substrate 21 and sequentially penetrates the hole injection layer 223, the hole transport layer 224, the organic light-emitting layer 222, the electron transport layer 225 and the cathode 226.

Due to the presence of the barrier 23, the carriers in the OLED subpixel 22 and the carriers in the OLED subpixel 24 are blocked by the barrier 23 when the carriers being diffused in the respective transport layers (eg, electron transport layer and hole transport layer), both carriers will not be able to diffuse into the other transmission layer and will not interfere with the other electron-hole recombination emission. Therefore, it is possible to prevent the light-emitting crosstalk between adjacent OLED subpixels 22 and 24, and avoid the color coordinates shift of the OLED subpixels.

In the present embodiment, as shown in FIG. 2, the barrier 23 penetrates the cathode 226, and the top of the barrier 23 has a height difference from the cathode 226. This height difference facilitates the deposition of other layers through FFM (Fine Metal Mask) in subsequent processes. The FFM is placed at the top of the barrier 23, which supports the FFM and prevents the FFM from directly contacting the OLED subpixel.

Besides, adjacent pixels with the same color do not cause a color shift anomaly even if carrier diffusion occurs. Therefore, the adjacent OLED subpixels with the same color may not have the barrier 23 therebetween.

As shown in FIG. 2, in this embodiment, the substrate 21 may include an array substrate 212 and a planarization layer (PLN layer) 211 sequentially stacked. A protective layer (PDL layer) 213 may also be deposited over the planarization layer 211. The protection layer 213 is located between two adjacent OLED subpixels, for example, between the OLED subpixels 22 and 24. The portion of the protective layer 213 is located on the anode 221 and the anode 241 to protect the anode 221 and the anode 241. The barrier 23 may be provided on the protective layer 213 and may be the same material as the protective layer 213.

In this embodiment, a plurality of barriers 23 may be disposed around one OLED subpixel to block the OLED subpixels from carrier diffusion between adjacent OLED subpixels (the color of the OLED subpixel is different from that of other adjacent OLED subpixels). The plurality of barriers 23 are spaced apart from each other so as to avoid "enclosing" the single OLED subpixel from being completely isolated from other OLED subpixels, to ensure that the cathodes of the respective OLED subpixels can communicate with each other and conduct to a low potential. This will be described in detail below.

In the first embodiment of the present disclosure, a plurality of the OLED subpixels form a plurality of OLED pixels, wherein every two adjacent OLED pixels comprise four of the OLED subpixels, and four of the OLED Subpixels have three colors.

Figure 3:
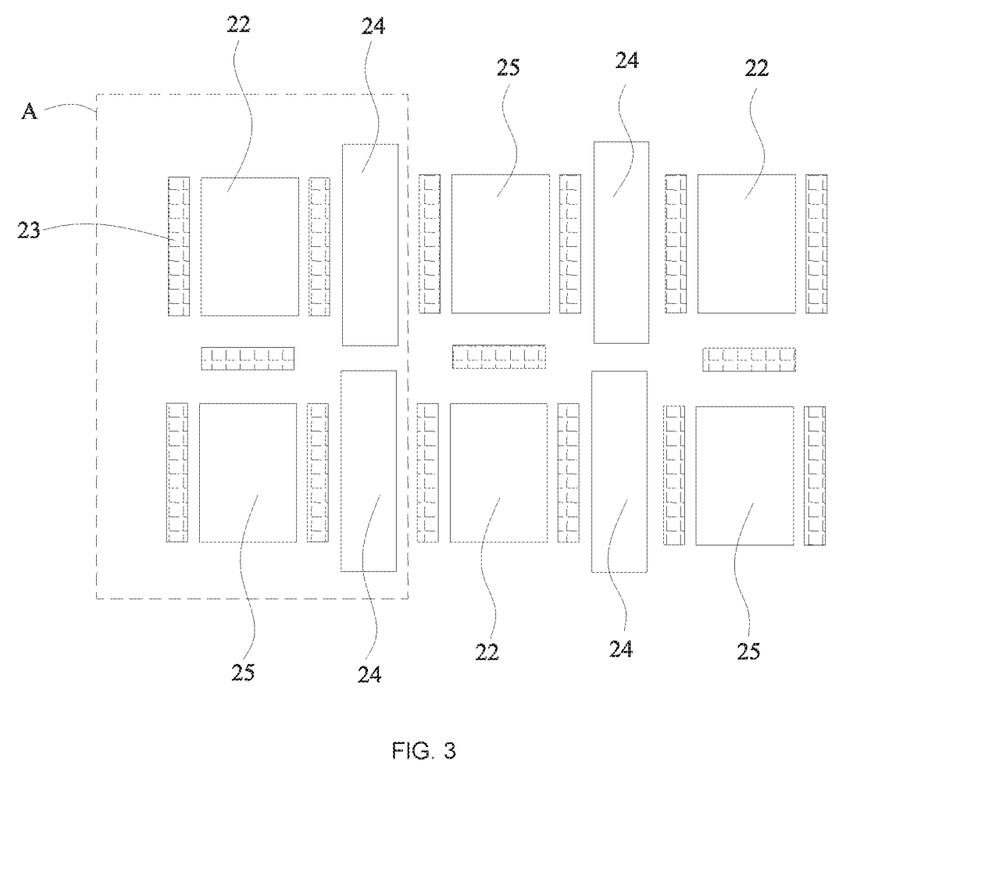
FIG. 3 is a schematic top view of an OLED device in a first embodiment of the present disclosure.

In particular, the plurality of OLED subpixels may form a plurality of OLED pixels in a specific arrangement, and each of the OLED pixels may include a plurality of the OLED subpixels. For example, a pentile arrangement is shown in as shown in FIG. 3. Wherein A represents two adjacent OLED pixels, A includes four OLED subpixels, that are an OLED subpixel 22, an OLED subpixel 25, and two OLED subpixels 24, respectively. The OLED subpixel 22 may be a blue subpixel, the OLED subpixel 25 may be a red subpixel, and the OLED subpixel 24 may be a green subpixel. In this pentile arrangement, the OLED subpixel 22 and the OLED subpixel 25 in A can be borrowed and exchanged from each other. Of course, in other embodiments, other arrangements of OLED subpixels may also be adopted.

In the first embodiment, one barrier 23 is disposed between two OLED subpixels with different colors among two adjacent OLED pixels, and a gap is provided between the two OLED subpixels with the same color. For example, as shown in FIG. 3, in A, a barrier 23 is disposed between the OLED subpixel 22 and the OLED subpixel 24 with different colors, a barrier 23 is provided between the OLED subpixel 22 and the OLED subpixel 25 with different colors, and a barrier 23 is provided between the OLED subpixels 24 and the OLED subpixels 25 with different colors. A gap is provided between the two OLED subpixels 24 with the same color.

In the first embodiment, the barrier 23 disposed between the two OLED subpixels with different colors can block the carrier diffusion between the two OLED subpixels and avoid the color coordinate shift of the OLED subpixel, and the barrier 23 may not be disposed between two adjacent OLED subpixels 24 with the same color. In addition, a plurality of spaced-apart barriers 23 can be provided at the periphery of one OLED subpixel (eg, barriers 23 are provided at both the periphery of OLED subpixels 22 and OLED subpixel 25, barriers 23 are provided only at two adjacent sides of OLED subpixel 22 and OLED subpixel 25) so as to block the carrier diffusion between the OLED subpixel and other OLED subpixels adjacent thereto, to ensure that the cathode of each of the OLED subpixels can be connected and turned on to a low potential.

Figure 4:
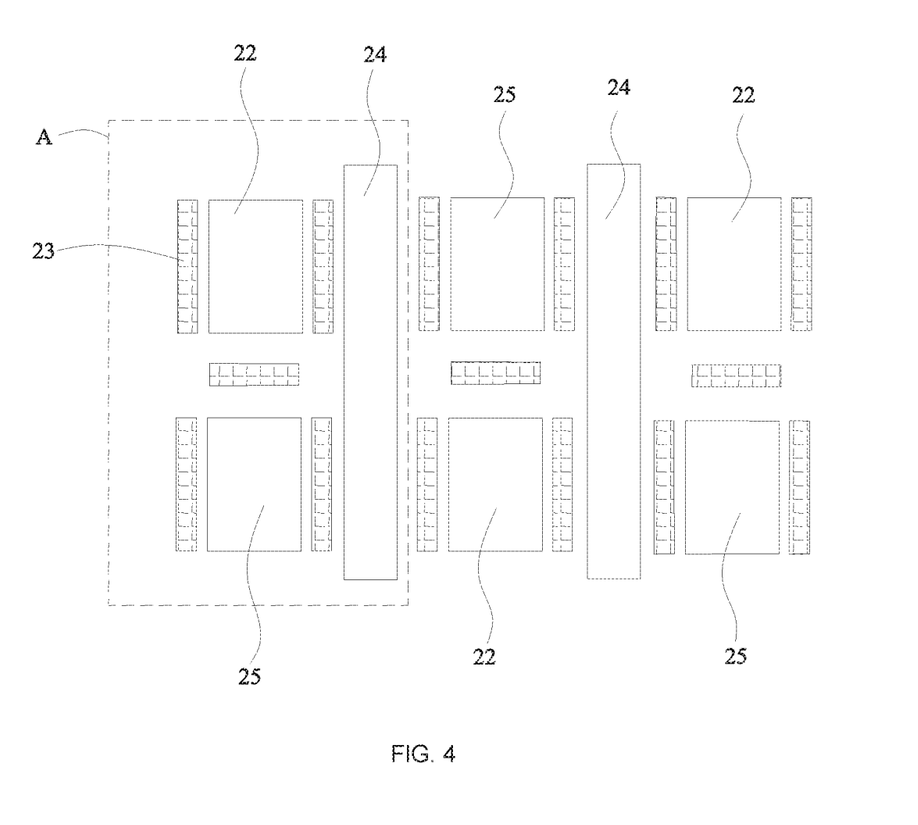
FIG. 4 is a schematic top view of an OLED device in a second embodiment of the present disclosure.

In the second embodiment of the present disclosure, different from the above-described first embodiment, among two adjacent OLED pixels, two of the OLED subpixels with the same color are integrally connected. For example, as shown in FIG. 4, in A, two OLED subpixels 24 with the same color are integrally connected. Such a design facilitates simplifying the OLED subpixel forming process and increases the display area of the OLED subpixel.

In the third embodiment of the present disclosure, different from the above-described first embodiment, among two adjacent OLED pixels, four OLED subpixels are arranged in a rhombus, one rhombus and another adjacent rhombus share one of the OLED subpixels; and in each of the rhombuses; the two OLED subpixels with the same color are respectively located at two opposite vertexes of the rhombus; and one of the barriers is provided on each side of the rhombus.

Figure 5:
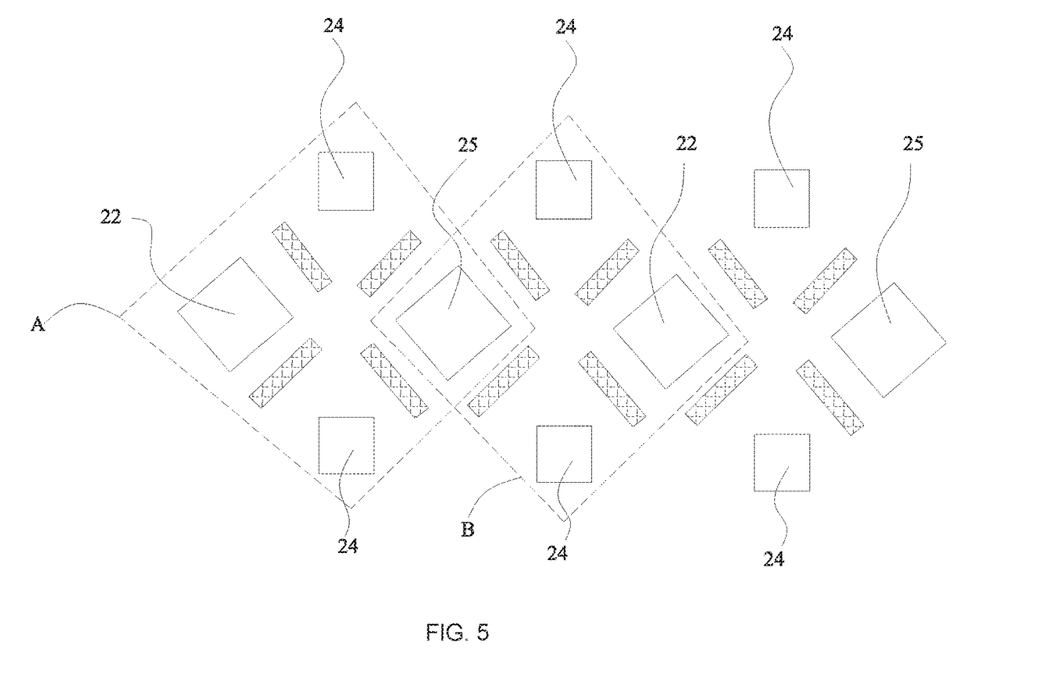
FIG. 5 is a schematic top view of an OLED device in a third embodiment of the present disclosure.

For example, as shown in FIG. 5, A represents two adjacent OLED pixels, and B represents another two adjacent OLED pixels, where A and B are adjacent to each other and overlap on an existing area. Specifically, both A and B are rhombus-shaped, and A and B each include an OLED subpixel 22, an OLED subpixel 25, and two OLED subpixels 24. And, A and B share one OLED subpixel 25. In A and B, two OLED subpixels 24 with the same color are located at two opposite vertexes of the rhombus, respectively. In A and B, a barrier 23 is provided on each side of the rhombus to block the electron diffusion between each of the OLED subpixels and the other OLED subpixels adjacent thereto. The OLED subpixel arrangement in this embodiment may be referred to as a rhombus arrangement of the pentile arrangement.

Figure 6:
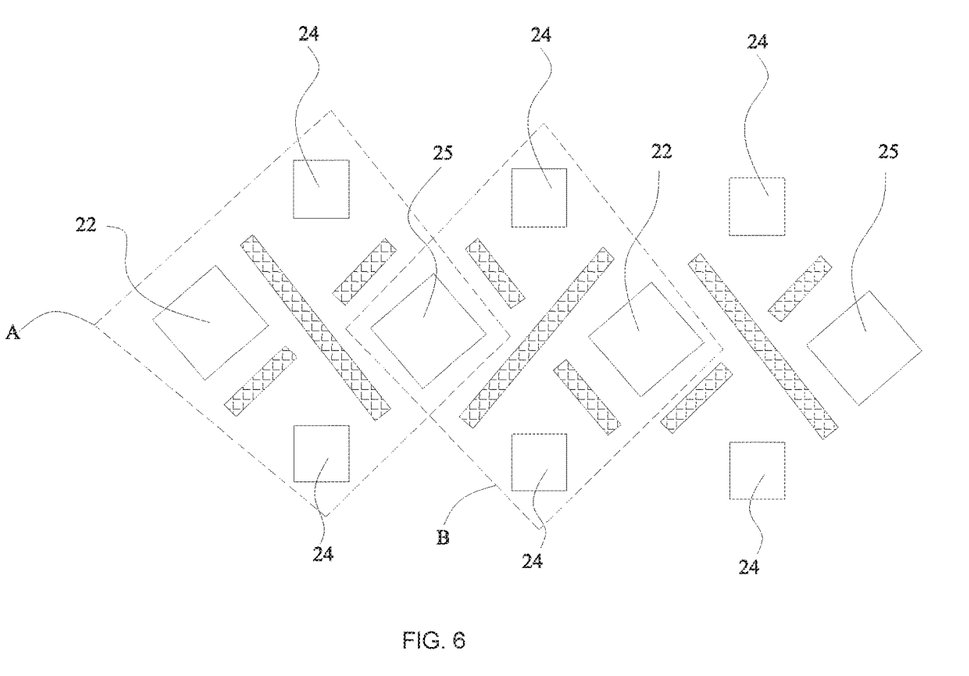
FIG. 6 is a schematic top view of an OLED device in a fourth embodiment of the present disclosure.
Figure 7:
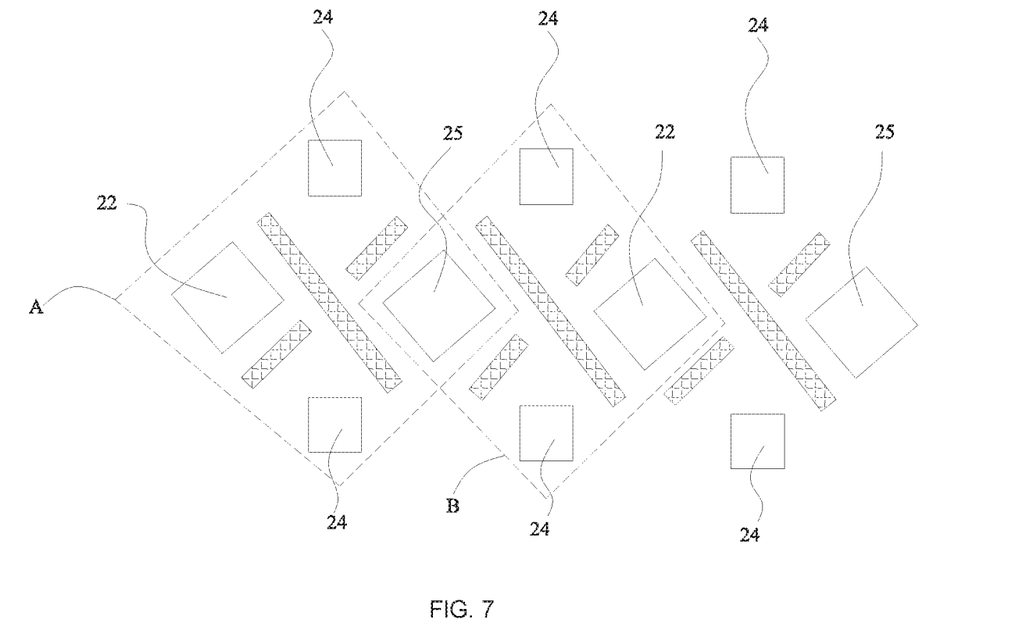
FIG. 7 is a schematic top view of another OLED device in the fourth embodiment of the present disclosure.
Figure 8:
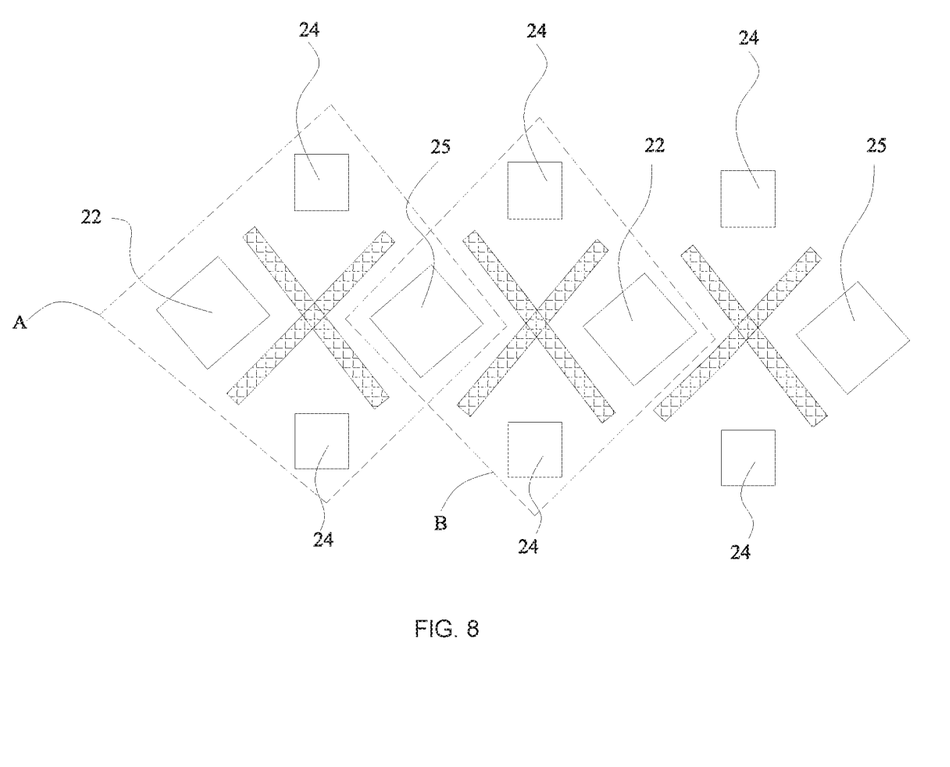
FIG. 8 is a schematic top view of yet another OLED device in the fourth embodiment of the present disclosure.

In the fourth embodiment of the present disclosure, different from the above-mentioned third embodiment, in each of the rhombuses, two of the barriers located on the two opposite sides of the rhombus are connected to form a straight line. The embodiment may include two cases: only one set of two barriers 23 on the opposite side of the rhombus is connected to form a straight line, as shown in FIG. 6 and FIG. 7; or two sets of four barriers 23 on the opposite side of the rhombus are respectively connected into two straight lines, as shown in FIG. 8. In the present embodiment, the linear barrier 23 can simplify the molding process of the barrier 23, reinforce the function of the barrier 23 to prevent the carrier diffusion, and further avoid the color coordinate shift of the OLED subpixel.

In addition, in the fourth embodiment, among the plurality of rhombuses in the same row, each of every two adjacent straight lines has an included angle to form a wavy shape. For example, as shown in FIG. 6, the rhombus corresponding to A and the rhombus corresponding to B are in the same row, and the straight line in the rhombus of A forms an included angle with the straight line in the rhombus of B to form a undulate wavy shape.

Or, in the fourth embodiment, the plurality of the straight lines among the plurality of rhombuses are parallel. For example, as shown in FIG. 7, the straight line in the rhombus of A and the straight line in the rhombus of B are parallel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An OLED device, comprising a substrate on which a plurality of OLED subpixels are arranged, wherein an insulating barrier is provided between every two adjacent OLED subpixels with different colors, and the barrier is configured to block a carrier diffusion between the two adjacent OLED subpixels,
    wherein each of the OLED subpixels comprises an anode, a hole injection layer, a hole transport layer, an organic light-emitting layer, an electron transport layer and a cathode sequentially stacked on the substrate; the barrier is disposed on the substrate and sequentially penetrates the hole injection layer, the hole transport layer, the organic light-emitting layer, the electron transport layer and the cathode, and
    wherein the barrier separates the cathodes between the two adjacent OLED subpixels with different colors, and the plurality of OLED subpixels form a plurality of OLED pixels, each of every two adjacent OLED pixels comprises four OLED subpixels, and the four OLED subpixels have three colors,
    wherein among the two adjacent OLED pixels, four OLED subpixels are arranged in a rhombus, one rhombus and another adjacent rhombus share one of the OLED subpixels; and in each of the rhombuses, the two OLED subpixels with the same color are respectively located at two opposite vertexes of the rhombus; and one of the barriers is provided on each side of the rhombus, and
    wherein in each of the rhombuses, two of the barriers located on opposite sides of the rhombus are connected in a straight line.

2. The OLED device according to claim 1, wherein among the two adjacent OLED pixels, one barrier is provided between the two OLED subpixels with different colors, and a gap is provided between the two OLED subpixels having the same color.

3. The OLED device according to claim 1, wherein among the two adjacent OLED pixels, one barrier is provided between the two OLED subpixels with different colors, and the two OLED subpixels with the same color are integrally connected.

4. The OLED device according to claim 1, wherein among the plurality of rhombuses in the same row, each of every two adjacent straight lines has an included angle to form a wavy shape.

5. The OLED device according to claim 1, wherein the plurality of the straight lines among the plurality of rhombuses are parallel.

6. A display apparatus, comprising the OLED device of claim 1.

7. The display apparatus according to claim 6, wherein among the two adjacent OLED pixels, one barrier is provided between the two OLED subpixels with different colors, and a gap is provided between the two OLED subpixels having the same color.

8. The display apparatus according to claim 6, wherein among the two adjacent OLED pixels, one barrier is provided between the two OLED subpixels with different colors, and the two OLED subpixels with the same color are integrally connected.

9. The display apparatus according to claim 6, wherein among the plurality of rhombuses in the same row, each of every two adjacent straight lines has an included angle to form a wavy shape.

10. The display apparatus according to claim 6, wherein the plurality of the straight lines among the plurality of rhombuses are parallel.

* * * * *